(12) United States Patent
Huang et al.

(10) Patent No.: US 10,041,548 B2
(45) Date of Patent: Aug. 7, 2018

(54) SILICON WAFER EDGE PROTECTION DEVICE WITH COLLISION PROTECTION FUNCTION

(71) Applicant: SHANGHAI MICRO ELECTRONICS EQUIPMENT CO., LTD., Shanghai (CN)

(72) Inventors: Jingli Huang, Shanghai (CN); Yuebin Zhu, Shanghai (CN)

(73) Assignee: Shanghai Micro Electronics Equipment (Group) Co., Ltd., Shanghai (CN)

( * ) Notice: Subject to any disclaimer, the term of this patent is extended or adjusted under 35 U.S.C. 154(b) by 222 days.

(21) Appl. No.: 15/108,083

(22) PCT Filed: Dec. 26, 2014

(86) PCT No.: PCT/CN2014/095044
§ 371 (c)(1),
(2) Date: Jun. 24, 2016

(87) PCT Pub. No.: WO2015/096795
PCT Pub. Date: Jul. 2, 2015

(65) Prior Publication Data
US 2016/0341256 A1 Nov. 24, 2016

(30) Foreign Application Priority Data
Dec. 27, 2013 (CN) .......................... 2013 1 0734687

(51) Int. Cl.
*F16D 7/04* (2006.01)
*H01L 21/687* (2006.01)
(Continued)

(52) U.S. Cl.
CPC ........ *F16D 7/048* (2013.01); *H01L 21/67288* (2013.01); *H01L 21/67742* (2013.01);
(Continued)

(58) Field of Classification Search
None
See application file for complete search history.

(56) References Cited

U.S. PATENT DOCUMENTS 5,740,009 A 4/1998 Pu et al.
2009/0283642 A1* 11/2009 Gemmati ................ B64C 13/24
244/178
(Continued)

FOREIGN PATENT DOCUMENTS

CN 101487990 A 7/2009
CN 101609193 A 12/2009
(Continued)

*Primary Examiner* — Jacob S Scott
(74) *Attorney, Agent, or Firm* — Muncy, Geissler, Olds & Lowe, P.C.

(57) ABSTRACT

A wafer edge protection apparatus, including an electrical control module having a servomotor, a vertical motion mechanism and a protection mechanism. The protection mechanism includes: a shaft coupler, in fixed connection with a shaft of the servomotor and having a plurality of first connecting components; and a transmission sleeve, in fixed connection with the vertical motion mechanism and having a plurality of second connecting components in movable connection with the plurality of first connecting components. The plurality of first connecting components is in movable connection with the plurality of second connecting components such that, in the event of a torque output by the shaft of the servomotor not exceeding a limit, the plurality of first connecting components is engaged with the plurality of second connecting components, and in the event of the torque output by the shaft of the servomotor exceeding the limit, the plurality of first connecting components is disengaged from the plurality of second connecting components, thereby preventing a rotational motion generated by the servomotor from transferring to the vertical motion mechanism.

12 Claims, 2 Drawing Sheets

(51) Int. Cl.
*H01L 21/67* (2006.01)
*H01L 21/677* (2006.01)
(52) U.S. Cl.
CPC .. *H01L 21/67766* (2013.01); *H01L 21/68707* (2013.01); *H01L 21/68735* (2013.01); *H01L 21/68742* (2013.01); *H01L 21/68792* (2013.01)

(56) References Cited

U.S. PATENT DOCUMENTS

2012/0073928 A1* 3/2012 Jaeger .................... F16D 7/048
　　　　　　　　　　　　　　　　　　　　　　　　　192/46
2014/0224611 A1* 8/2014 Falk ...................... F16D 1/0805
　　　　　　　　　　　　　　　　　　　　　　　　　192/75

FOREIGN PATENT DOCUMENTS

| CN | 102012639 A | 4/2011 |
| CN | 102141735 A | 8/2011 |
| CN | 102203930 A | 9/2011 |

* cited by examiner

SILICON WAFER EDGE PROTECTION DEVICE WITH COLLISION PROTECTION FUNCTION

TECHNICAL FIELD

The present invention relates to semiconductor manufacturing equipment and, more particularly, to a wafer edge protection apparatus with collision protection capabilities for use in photolithography tools.

BACKGROUND

In the field of integrated circuit (IC) manufacturing, wafer edge protection apparatuses are used for improving wafer processing efficiency by protecting the edge of wafers coated with negative photoresist during the wafer exposure process, and thus considered as a necessary enabler for simultaneous wafer exposure and edge protection. In order to achieve wafer edge protection during exposure, such an apparatus is required to be deployed within an exposure apparatus (photolithography tool) at such a proper position relative to a wafer stage carrying the wafer that, upon the stage moving fast to a transfer position, it can place an edge protection ring over the wafer for edge protection. In such a spatial environment with the aforementioned operating conditions, the apparatus is required to be very reliable because any collision, no matter why and how it occurs, as well as how strong its impact is, may make the wafer useless, or lead to impaired performance of and, in worse cases, even physical damage to, the photolithography tool. Therefore, there is a critical need for safer, more reliable edge protection means.

Chinese Patent Application No. 200910055394.X discloses a method and device for wafer edge protection, and Chinese Patent Application No. 201010102423.6 discloses a wafer edge protection device and its use. However, neither of these devices is capable of collision protection in terms of mechanics or pneumatic control. For this reason, during their operation, there is still a potential for damage to be caused by collisions to the wafer and photolithography tool.

SUMMARY OF THE INVENTION

In order to overcome the deficiencies of the prior art, the present invention proposes a wafer edge protection apparatus including an electrical control module and a vertical motion mechanism. The electrical control module includes a servomotor for generating a rotational motion. The wafer edge protection apparatus further includes a protection mechanism including: a shaft coupler, in fixed connection with a shaft of the servomotor and having a plurality of first connecting components; and a transmission sleeve, in fixed connection with the vertical motion mechanism and having a plurality of second connecting components in movable connection with the plurality of first connecting components such that in an event of a torque output by the shaft of the servomotor not exceeding a limit, the plurality of first connecting components are engaged with the plurality of second connecting components, thereby allowing transfer of the rotational motion generated by the servomotor to the vertical motion mechanism for driving the vertical motion mechanism to move vertically, and in an event of the torque output by the shaft of the servomotor exceeding the limit, the plurality of first connecting components are disengaged from the plurality of second connecting components, thereby preventing the rotational motion generated by the servomotor from transferring to the vertical motion mechanism.

Preferably, the shaft coupler is substantially cylindrical; the transmission sleeve has an annular wall circumferentially surrounding the shaft coupler, the plurality of first connecting components are circumferentially disposed on the shaft coupler; the plurality of first connecting components have end portions radially projecting beyond a surface of the shaft coupler; the plurality of second connecting components are a plurality of recesses circumferentially distributed on an inner surface of the annular wall; and the plurality of recesses correspond to the end portions of the plurality of first connecting components in shape and position.

Preferably, each of the plurality of first connecting components includes: a transmission sliding pin disposed radially in the shaft coupler in a slideable manner, an end portion of the transmission sliding pin projects beyond the surface of the shaft coupler; and a compressible spring disposed circumferentially over the transmission sliding pin, the compressible spring is fixed to a spring retainer at one end and abutting against the end portion of the transmission sliding pin on the other end, thereby exerting, on the end portion of the transmission sliding pin, a force toward a corresponding one of the plurality of recesses on the transmission sleeve.

Preferably, each compressible spring is configured to firmly press the end portion of the corresponding transmission sliding pin in the corresponding one of the plurality of recesses in the event of the torque output by the shaft of the servomotor not exceeding the limit, and to allow the end portion of the corresponding transmission sliding pin to rotate relative to the transmission sleeve and thereby escape from the corresponding one of the plurality of recesses in the event of the torque output by the shaft of the servomotor exceeding the limit.

Preferably, the force exerted by each compressible spring on the end portion of the corresponding transmission sliding pin is determined by radial position of the spring retainer within the shaft coupler.

Preferably, the end portion of the transmission sliding pin is a conical tip having a diameter gradually decreasing along a direction from the shaft coupler to the transmission sleeve, and the end portion of the transmission sliding pin has a shape in correspondence with a shape of the corresponding one of the plurality of recesses.

Preferably, the protection mechanism further includes a switch device configured to control the servomotor to stop outputting the torque when the plurality of first connecting components are disengaged from the plurality of second connecting components.

Preferably, the switch device includes a limit bolt fixed on the shaft coupler and a limit switch fixed on the transmission sleeve, such that the limit bolt and the limit switch are not in contact with each other in case of the plurality of first connecting components being engaged with the plurality of second connecting components, and the limit bolt and the limit switch are in contact with each other, thereby controlling the servomotor to stop outputting the torque, in case of the plurality of first connecting components being disengaged from the plurality of second connecting components.

Preferably, the vertical motion mechanism includes a screw lever in fixed connection with the transmission sleeve.

Preferably, numbers of the first and the second connecting components are both three.

The proposed wafer edge protection apparatus has collision protection capabilities for preventing the adverse consequences of collision-caused overloads. Therefore, it eliminates the potential for accidents, thereby improving photolithography tool safety and reliability and minimizing wafer damage.

BRIEF DESCRIPTION OF THE DRAWINGS

The advantages and spirit of the invention will be better understood from the following detailed description when considered with reference to the accompanying drawings, in which.

DETAILED DESCRIPTION

Some exemplary embodiments of the present invention will be described below with reference to the accompanying drawings.

Figure 1:
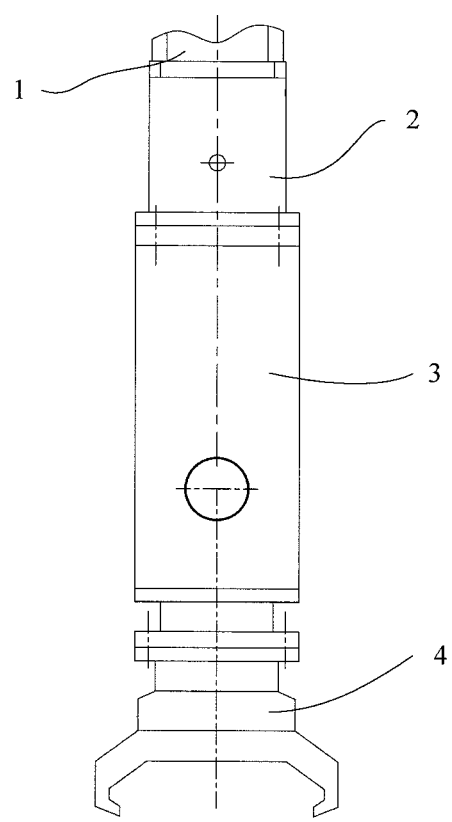
FIG. 1 is a schematic illustration of a wafer edge protection apparatus with collision protection capabilities, according to the present invention.

As shown in FIG. 1, the present invention provides a wafer edge protection apparatus with collision protection capabilities, which is coupled to a mechanical pick-up arm 4 and is comprised of an electrical control module (including a servomotor 1), a collision protection mechanism 2 and a vertical motion mechanism 3. The servomotor 1 of the electrical control module is mounted on the collision protection mechanism 2, and the servomotor 1 is configured to transmit a rotational motion to the vertical motion mechanism 3 via this collision protection mechanism 2. The rotational motion is then converted by the vertical motion mechanism 3 to a transitional motion for causing the pick-up arm 4 to move to a predetermined transfer position to receive an edge protection ring which enables wafer edge protection during wafer exposure.

Figure 2:
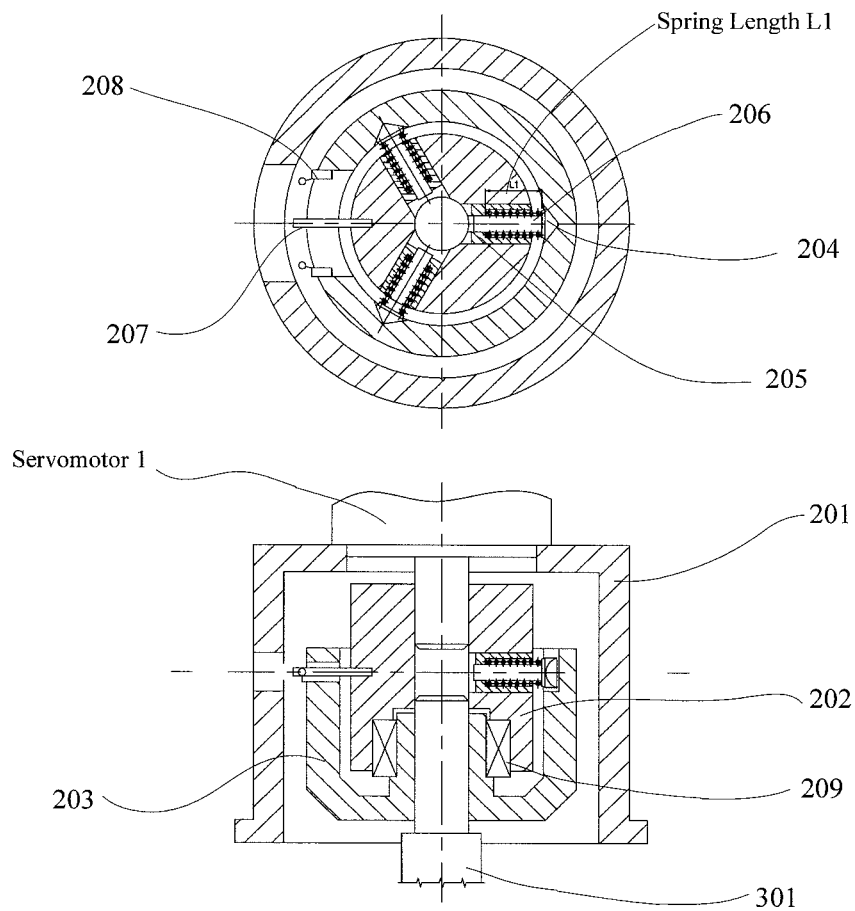
FIG. 2 schematically shows a collision protection mechanism in a wafer edge protection apparatus according to the present invention.

As shown in FIG. 2, according to one embodiment example, the collision protection mechanism 2 is composed of a motor base 201, a shaft coupler 202, a transmission sleeve 203, transmission sliding pins 204, spring retainers 205, a limit bolt 207, a locating bearing 209 and a limit switch 208. The collision protection mechanism 2 is disposed between the servomotor 1 and the vertical motion mechanism 3 to receive a motion and a desired torque from the servomotor at the top of the collision protection mechanism 2 and output the motion and torque to a screw lever 301 of the vertical motion mechanism 3 at the bottom. In addition, it is configured to automatically decouple the input and output upon any accidental collision occurring during the operation, i.e., separating the actuating servomotor 1 from the screw lever 301 of the vertical motion mechanism 3. This leads to safe separation and actuation cessation, thereby providing protection to the photolithography tool and the wafer.

In a specific embodiment:

The servomotor 1 is mounted on the motor base 201 of the collision protection mechanism 2 by screws, and the motor base 201 of the collision protection mechanism 2 is fixed on the vertical motion mechanism 3. The collision protection mechanism 2 is configured to transfer a rotational motion of the servomotor 1 to the vertical motion mechanism 3. The vertical motion mechanism 3 is configured to convert this rotational motion to a translational motion, thereby causing the pick-up arm 4 that is mounted on the bottom of the vertical motion mechanism 3, to move into or out of the transfer position for placement of the edge protection ring. Wafer edge protection during exposure is therefore achieved by the pick-up arm 4 placing the edge protection ring on the wafer or picking the edge protection ring up from the wafer.

Figure 3:
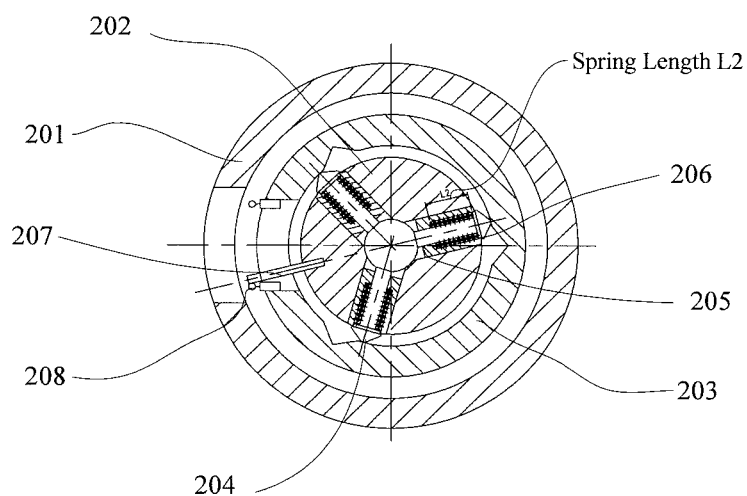
FIG. 3 is a diagram showing transmission sliding pins being disengaged from a transmission sleeve in a wafer edge protection apparatus according to the present invention.

As illustrated in FIG. 2, during operation, with the servomotor 1 being switched on, a shaft (not shown) of the servomotor 1 starts to rotate. As the shaft coupler 202 of the collision protection mechanism 2 is in fixed connection with the shaft, the shaft coupler 202 rotates along with the shaft at a constant speed. Three transmission sliding pins 204 are disposed in the shaft coupler 202, with each of the transmission sliding pins 204 having an end portion projecting beyond the surface of the shaft coupler 202. The shaft coupler 202 is substantially cylindrical, and compressible springs 206 (each having an initial length of L1) are disposed over the respective sliding pins 204. Each of the compressible springs 206 is fixed to a spring retainer 205 on one end, and abuts against said end of a corresponding one of the transmission sliding pins 204 to exert on the transmission sliding pins 204 a force toward a corresponding recess on the transmission sleeve 203. Under the effect of the compressible springs 206 (i.e., at a compressed state of the compressible springs 206), the conical tips of the three transmission sliding pins 204 (i.e., the end portions of the three transmission sliding pins radially protruding out of the surface of the shaft coupler 202) always engage with the respective recesses on the transmission sleeve 203. This enables the conical tips of the transmission sliding pins 204 to pass the rotational motion of the motor shaft on to the transmission sleeve 203. The three transmission sliding pins 204 are so disposed within the shaft coupler 202 as to be equidistant and able to slide radially, and the recesses on the transmission sleeve 203 are adapted to the corresponding conical tips of the transmission sliding pins 204 in shape and position. The transmission sleeve 203 further works with the screw lever 301 of the vertical motion mechanism 3 to additionally transfer the shaft motion to the vertical motion mechanism 3, by which the motion is translated to repeated movements of the pick-up arm 4 from an initial position to the transfer station for wafer exposure and then back to the initial position. During these iterative movements, upon any accidental collision that can cause the motor to output an increased torque response exceeding a limit, as shown in FIG. 3, instant increases will occur in forces acting on the conical tips of the transmission sliding pins 204, causing the transmission sliding pins 204 to further compress the springs 206 until the conical tips of the transmission sliding pins 204 are disengaged from the recesses on the transmission sleeve 203. The disengagement will interrupt the transfer of the overload torque from the servomotor 1 and thus achieve protection. At this time, the further compressed springs 206 each has a length of L2, and due to the further compression, L1>L2. The collision protection mechanism 2 further includes a limit bolt 207 fixed on the shaft coupler 202, and a limit switch 208 in fixed connection with the transmission sleeve 203. When operating normally, there is no relative rotation between the shaft coupler 202 and the transmission sleeve 203, with the limit bolt 207 and the limit switch 208 both situated at their initial positions (i.e., not in contact with each other). Upon a collision that has caused a relative rotation between the shaft coupler 202 and the transmission sleeve 203, the limit bolt 207 and the limit switch 208 will come into contact with each other, producing a signal indicating the servomotor 1 to cease operation. After the consequences of the collision have been prevented, normal operation can be resumed by causing the conical tips to reengage with proximal recesses by slowly inching the servomotor 1 or manually rotating the transmission sleeve 203. As the motor torque transfer is enabled by frictional components of the forces acting on the conical tips of the transmission sliding pins 204, torque adjustment is possible by changing the frictional forces through tuning the spring pretensions. The torque limit thus corresponds to the magnitude of frictional components that can compress the springs 206 from L1 to L2, and can be set by arranging the spring retainers 205 at proper depths within their accommodating receptacles defined by the shaft coupler 202.

Of course, apart from the mechanical collision protection, the present invention may optionally have conventional current overload protection for deactivating the motor in cases of excessively high electrical currents. As this technique is rather mature, a detailed description is omitted herein.

Disclosed herein are merely several preferred embodiments of the present invention, which are presented only to illustrate rather than limit the invention in any way. Any other technical schemes resulting from logical analysis, inference or limited experimentation by those skilled in the art in light of this inventive concept is considered to fall within the scope of the present invention.

What is claimed is:

1. A wafer edge protection apparatus, comprising an electrical control module and a vertical motion mechanism, the electrical control module comprising a servomotor for generating a rotational motion, wherein the wafer edge protection apparatus further comprises a protection mechanism comprising:
    a shaft coupler, in fixed connection with a shaft of the servomotor and having a plurality of first connecting components; and
    a transmission sleeve, in fixed connection with the vertical motion mechanism and having a plurality of second connecting components in movable connection with the plurality of first connecting components such that
    in an event of a torque output by the shaft of the servomotor not exceeding a limit, the plurality of first connecting components are engaged with the plurality of second connecting components, thereby allowing transfer of the rotational motion generated by the servomotor to the vertical motion mechanism for driving the vertical motion mechanism to move vertically, and
    in an event of the torque output by the shaft of the servomotor exceeding the limit, the plurality of first connecting components are disengaged from the plurality of second connecting components, thereby preventing the rotational motion generated by the servomotor from transferring to the vertical motion mechanism.

2. The wafer edge protection apparatus according to claim 1, wherein:
    the shaft coupler is substantially cylindrical; the transmission sleeve has an annular wall circumferentially surrounding the shaft coupler; the plurality of first connecting components are circumferentially disposed on the shaft coupler; the plurality of first connecting components have end portions radially projecting beyond a surface of the shaft coupler; the plurality of second connecting components are a plurality of recesses circumferentially distributed on an inner surface of the annular wall; and the plurality of recesses correspond to the end portions of the plurality of first connecting components in shape and position.

3. The wafer edge protection apparatus according to claim 2, wherein each of the plurality of first connecting components comprises:
    a transmission sliding pin disposed radially in the shaft coupler in a slideable manner, an end portion of the transmission sliding pin projecting beyond the surface of the shaft coupler; and
    a compressible spring disposed circumferentially over the transmission sliding pin, the compressible spring being fixed to a spring retainer at one end and abutting against the end portion of the transmission sliding pin on the other end, thereby exerting, on the end portion of the transmission sliding pin, a force toward a corresponding one of the plurality of recesses on the transmission sleeve.

4. The wafer edge protection apparatus according to claim 3, wherein the force exerted by each compressible spring on the end portion of the corresponding transmission sliding pin is determined by radial position of the spring retainer within the shaft coupler.

5. The wafer edge protection apparatus according to claim 3, wherein the end portion of the transmission sliding pin is a conical tip having a diameter gradually decreasing along a direction from the shaft coupler to the transmission sleeve, and the end portion of the transmission sliding pin has a shape in correspondence with a shape of the corresponding one of the plurality of recesses.

6. The wafer edge protection apparatus according to claim 3, wherein each compressible spring is configured to firmly press the end portion of the corresponding transmission sliding pin in the corresponding one of the plurality of recesses in the event of the torque output by the shaft of the servomotor not exceeding the limit, and to allow the end portion of the corresponding transmission sliding pin to rotate relative to the transmission sleeve and thereby escape from the corresponding one of the plurality of recesses in the event of the torque output by the shaft of the servomotor exceeding the limit.

7. The wafer edge protection apparatus according to claim 6, wherein the force exerted by each compressible spring on the end portion of the corresponding transmission sliding pin is determined by radial position of the spring retainer within the shaft coupler.

8. The wafer edge protection apparatus according to claim 6, wherein the end portion of the transmission sliding pin is a conical tip having a diameter gradually decreasing along a direction from the shaft coupler to the transmission sleeve, and the end portion of the transmission sliding pin has a shape in correspondence with a shape of the corresponding one of the plurality of recesses.

9. The wafer edge protection apparatus according to claim 1, wherein the protection mechanism further comprises a switch device configured to control the servomotor to stop outputting the torque when the plurality of first connecting components are disengaged from the plurality of second connecting components.

10. The wafer edge protection apparatus according to claim 9, wherein the switch device comprises a limit bolt fixed on the shaft coupler and a limit switch fixed on the transmission sleeve, such that
    the limit bolt and the limit switch are not in contact with each other in case of the plurality of first connecting components being engaged with the plurality of second connecting components, and the limit bolt and the limit switch are in contact with each other, thereby controlling the servomotor to stop outputting the torque, in case of the plurality of first connecting components being disengaged from the plurality of second connecting components.

11. The wafer edge protection apparatus according to claim 1, wherein the vertical motion mechanism comprises a screw lever in fixed connection with the transmission sleeve.

12. The wafer edge protection apparatus according to claim 1, wherein numbers of the first and the second connecting components are both three.

\* \* \* \* \*